United States Patent [19]
Wing et al.

[11] Patent Number: 5,032,792
[45] Date of Patent: Jul. 16, 1991

[54] ELECTROMAGNETIC COIL ARRAY HAVING THREE ORTHOGONALLY RELATED COIL PAIRS FOR USE AS HELMHOLTZ AND DEGAUSSING COILS

[75] Inventors: Lloyd E. Wing, Dumont, N.J.; Edgar L. Freud, New York, N.Y.

[73] Assignee: United States of America, Washington, D.C.

[21] Appl. No.: 639,772

[22] Filed: Jan. 10, 1991

Related U.S. Application Data

[63] Continuation-in-part of Ser. No. 576,108, Apr. 5, 1990, abandoned, which is a continuation of Ser. No. 373,302, Jun. 28, 1989, abandoned.

[51] Int. Cl.$^5$ .................. G01R 33/12; H01F 13/00; G01N 27/72
[52] U.S. Cl. .................. 324/228; 324/232; 324/262; 361/146; 361/149
[58] Field of Search .................. 324/202, 226–228, 324/232, 242, 243, 247, 262, 377; 336/127, 170, 211, 230; 361/143, 146, 149–151

[56] References Cited

U.S. PATENT DOCUMENTS

| | | | |
|---|---|---|---|
| 2,105,650 | 1/1938 | Hering et al. | 324/377 |
| 3,375,438 | 3/1968 | Auer | 324/228 |
| 3,389,333 | 6/1968 | Wolff et al. | 324/202 X |
| 4,290,016 | 9/1981 | Lorenzi | 324/202 X |
| 4,575,695 | 3/1986 | Schloemann | 324/232 X |

FOREIGN PATENT DOCUMENTS 404030  3/1974  U.S.S.R. .................. 324/247

*Primary Examiner*—Gerard R. Strecker
*Attorney, Agent, or Firm*—Robert M. Wohlfarth; John P. Tarlano

[57] ABSTRACT

An array of nested sets of electromagnetic coils. Each set of two coils is useable both as Helmholtz coils and as deGaussing coils. In each set, the two coils are wound in the same direction and the two coils are on a common axis. The common axes of the three sets are mutually orthogonal. For each set of two coils, the outer two ends of the two coils are connected to two single terminals, while the inner two ends of the two coils are connected to one common terminal. By connecting one side of a DC power supply to one single terminal, and by connecting the other side of the DC power supply to the other single terminal, each set of two coils will operate as Helmholtz coils. By connecting one side of a DC power supply to parallel variable resistors, each resistor in turn being connected to a single terminal, and by connecting the other side of the DC power supply to the common terminal, each set of two coils will operate as deGaussing coils.

2 Claims, 5 Drawing Sheets

//patents.google.com/patent/US5032792A

ELECTROMAGNETIC COIL ARRAY HAVING THREE ORTHOGONALLY RELATED COIL PAIRS FOR USE AS HELMHOLTZ AND DEGAUSSING COILS

This is a continuation-in-part application of application Ser. No. 576,108, filed Apr. 5, 1990, now abandoned. The application Ser. No. 576,108 is a continuation of application Ser. No. 373,302, filed June 28, 1989, also now abandoned.

BACKGROUND OF THE INVENTION

1. Field of the Invention

The present invention relates to an array of three nested sets of electromagnetic coils. A common axis of two electromagnetic coils of one set is orthogonal to a common axis of two electromagnetic coils of each of the other two sets. The present invention also relates to a test device of which the array is a part.

2. Description of Related Art

U.S. Pat. No. 4,587,490 shows two coaxially aligned sets of electromagnetic coils. Two coils of one set lie between two coils of the other set.

U.S. Pat. No. 3,771,048 shows a single set of electromagnetic coils. The two axes of the two coils are coaxial. The coils produce a substantially uniform field in the general vicinity surrounding an axis through the coils. The coils are used as a part of a tester.

A thesis published in 1962 shows two sets of electromagnetic coils. One set of coils encompasses the other set of coils. A common axis of one set of coils is perpendicular to a common axis of the other set of coils. The diameters of the coils of one set are equal to the diameters of the coils of the other set. The two sets of coils are for the purpose of performing a physics experiment rather than being part of a tester. The thesis is in the Physics Library of the Ohio State University. The title of the thesis is "Spin Relaxation Time Of Optically Pumped Rubidium Vapor". The author is Edward W. Fisher.

The present invention relates to an array of three sets of electromagnetic coils. A common axis of one set of coils is orthogonal to a common axis of each of the other two sets. Further, a common diameter of one set of coils is less than a common diameter of an adjacent set of coils, so that the three sets of coils can nest.

The array of sets of coils can essentially neutralize, in three dimensions, the effects of extraneous magnetic fields, such as the earth's magnetic field, within the space encompassed by the array. The neutralization is essentially omni-directional. The coils can produce uniform magnetic fields in the directions of the three orthogonal common axes, within the space encompassed by the array.

The array is compact in its physical dimensions since the three sets of electromagnetic coils nest together. As the distance from the center of the array increases, the diameter of each successive set of coils increases.

The present invention also relates to a test device of which the disclosed array is a part.

SUMMARY OF THE INVENTION

The present invention relates to an array of nested electromagnetic coils. The array comprises a first set of electromagnetic coils that have a first diameter. The first set of electromagnetic coils has a common axis. The common axis of the first set of electromagnetic coils is in a first direction. The array also comprises a second set of electromagnetic coils that have a second diameter that is larger than the first diameter. The second set of electromagnetic coils encompasses the first set of electromagnetic coils. The second set of electromagnetic coils has a common axis. The common axis of the second set is essentially perpendicular to the common axis of the first set. The array further comprises a third set of electromagnetic coils that have a third diameter that is larger than the second diameter. The third set of electromagnetic coils encompasses the first and second sets of electromagnetic coils. The third set of electromagnetic coils has a common axis. The common axis of the third set is essentially perpendicular to the common axis of the first set and the common axis of the second set.

DESCRIPTION OF THE PREFERRED EMBODIMENT

Figure 1:
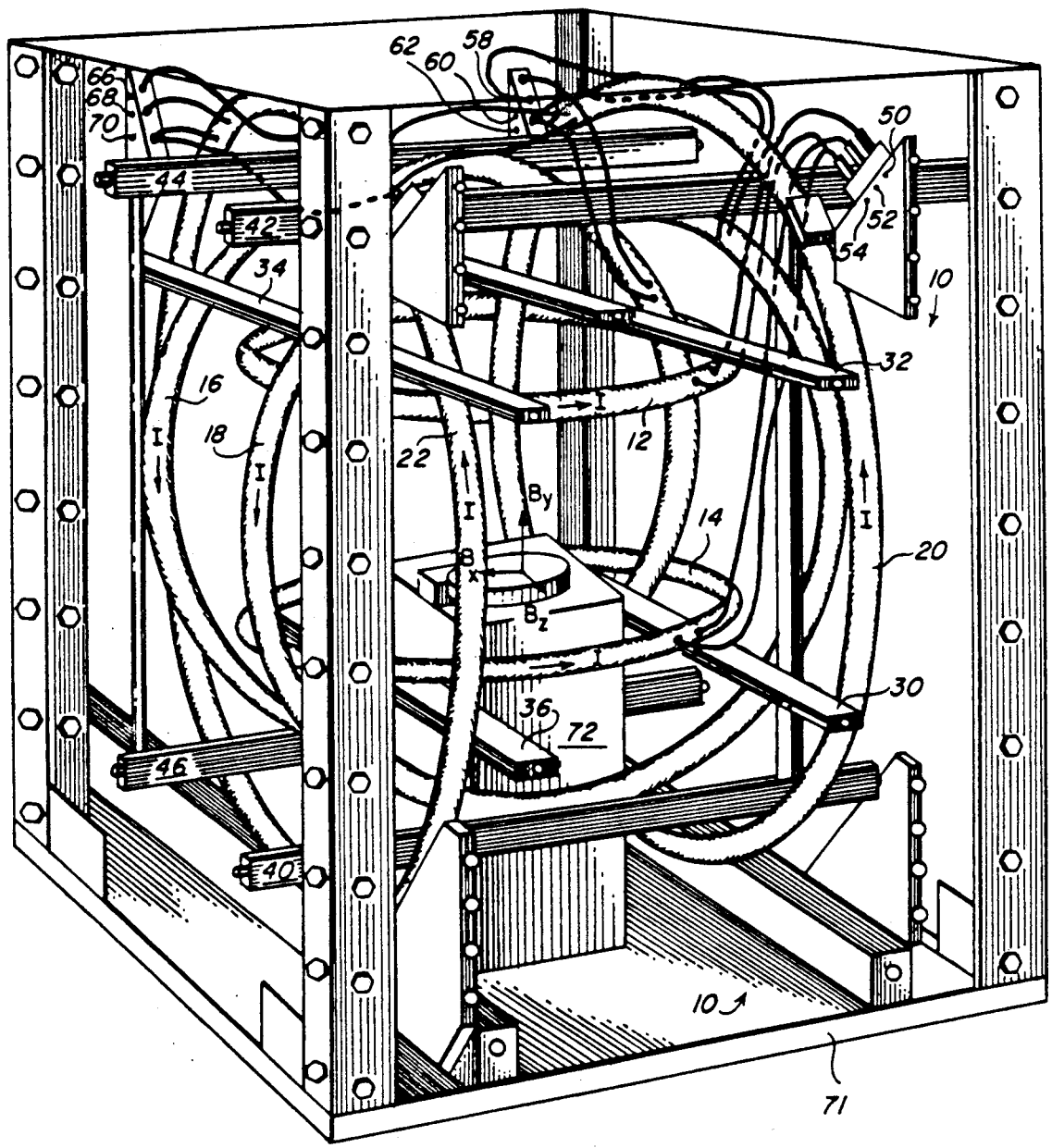
FIG. 1 is a perspective view of an array of three nested sets of electromagnetic coils, and of a test devive of which the array is a part of FIG. 1.

FIG. 1 shows an array 10 of three nested sets of electromagnetic coils. A first set of coils consists of coils 12 and 14. In the preferred embodiment the coils of this set have a diameter of sixteen inches. The coils 12 and 14 are separated from each other by a distance of eight inches. The coils 12 and 14 have a common axis that is essentially vertical, in FIG. 1.

A second set of coils consists of coils 16 and 18. The second set encompasses the first set. A common axis of the second set is essentially perpendicular to the common axis of the first set of coils. The diameter of each coil of the second set is twenty inches in the preferred embodiment. The coils 16 and 18 are separated from each other by a distance of ten inches.

A third set of coils encompasses the first two sets of coils. This third set consists of coils 20 and 22. A common axis of the third set is essentially perpendicular to the common axes of the first two mentioned sets of coils. The diameter of each coil in the third set is twenty six inches, in the preferred embodiment. The coils 20 and 22 are separated from each other by a distance of thirteen inches.

Thirty three turns of number ten enamel coated solid copper magnet wire are used to form each of coils 12 and 14. Forty one turns are used for coils 16 and 18. Fifty three turns are used for coils 20 and 22. The diameter of the wire is 0.102 inches.

The three sets of coils are nested within an open frame. The frame has an overall right parallelogram shape. The frame is nonmagnetic. The frame uses aluminum girders. The outside walls of the frame consist of clear plastic sheets. The frame is of sufficient size to support the three sets of coils.

FIG. 1 shows a frame that will support three nested sets of coils. The frame of FIG. 1 supports the six coils shown in FIG. 1. Rods 30, 32, 34 and 36 support coils 12 and 14. Rods 40, 42, 44 and 46 support the coils 16 and 18, and the coils 20 and 22.

The two ends of each coil of each set are attached to electrical terminals on the frame. The ends of coil 12 of the first set are connected to terminals 50 and 54. The ends of coil 14 are connected to terminals 54 and 52. The ends of the coil 16 of the second set are connected to terminals 58 and 62. The ends of coil 18 are connected to terminals 62 and 60. The ends of the coil 20 of the third set terminals are connected to terminals 66 and 70. The ends of the coil 22 are connected to terminals 70 and 68.

One coil of a set is connected in series circuit with the other coil of the set. Current is sent through each of the coils of a set in the same clockwise direction or counterclockwise direction. The direction of the current around a coil of a particular set will determine the direction of the magnetic flux that is perpendicular to the plane of the coil. Since the coils of FIG. 1 are connected so that the current in each coil of a set is in the same direction, the two coils of each set form a Helmholtz coil pair.

FIG. 1 also shows a test device 71 Test device 71 has a test stand 72 interior to the meshed array of three sets of electromagnetic coils. The common axes of these three sets of coils are mutually orthogonal. Electronic controls select the uniform magnetic field strength, generated along each common axis, for the region above the test stand 72. The magnetic field strength of a coil is determined by the equation $$B = ((\tfrac{1}{2})(M/I \times R \times R))/((R \times R + D \times D) \text{ three halves power})$$

M is the magnetic permeability in air. I is the current through a coil. R is the radius of a coil. D is the distance along the perpendicular axis of a coil and away from the center of a coil. $\times$ is the multiplication function.

Since the two coils in a given set have the same current going through them, the field produced by one coil will be the same as the field produced by the other. When the current in both coils is in a clockwise direction or when the current in both coils is in a counter clockwise direction, the magnetic fields of the two coils of a set augment each other. This is due to the fact that the fields produced by the two coils are in the same direction.

If the current in one coil is clockwise and the current in the other coil is clockwise, the magnetic field throughout the space between the coils is a constant value. This is due to the fact that magnetic field produced by one coil adds to the magnetic field produced by the other coil, to give a constant value, as one moves from one coil to the other. Thus each set of coils of FIG. 1 may be used as a set of Helmholtz coils to provide a nearly constant magnetic field between the set of coils. The produced magnetic field overwhelms the effects of the earth's magnetic field.

Alternatively, each set of coils of FIG. 1 could be used as deGaussing coils, to provide a zero magnetic field between that set of coils. In this deGaussing mode, the current in one coil of a set would be sent in an opposite direction to the current in the other coil of the set. When used as deGaussing coils, the electric current in one of the coils of a set can be made slightly greater than the current in the other coil of the set. This is used in order to completely cancel the effects of the earth's magnetic field.

At a distance of 150 centimeters (59 inches) a 26 inch coil will produce a magnetic flux emission of 1/100 of the flux directly at the plane of that coil. Ratios of the magnetic flux at a distance X from the coil, to the magnetic flux at the coil, and thus at X=0, may be calculated using the above formula. For example, if each of the 26 inch coils generates 10 gauss at its center on the coil axis, at 150 centimeters (59 inches) the produced flux is 0.1 gauss. Since the 26 inch coils have planes that are perpendicular to the planes of the 20 inch coils and 16 inch coils, the 26 inch coils will induce a flux in the 20 inch and 16 inch coils that is less than 1/100 of the flux produced by the 20 inch coils and 16 inch coils.

A test sample may be placed on test stand 72. The test sample may be given various directional orientations in the volume between coils 16 and 18. When the three sets of coils are used as Helmholtz coils, the earth's magnetic field will not effect the sample, even though it may be oriented in various directions. This is due to the fact that the sample is in three relatively strong uniform magnetic fields, that are along three mutual orthogonal axes. The sample will thus respond to tests, such as magnetic tests, free of the effects of the earth's magnetic field, or other extraneous magnetic fields.

Figure 2:
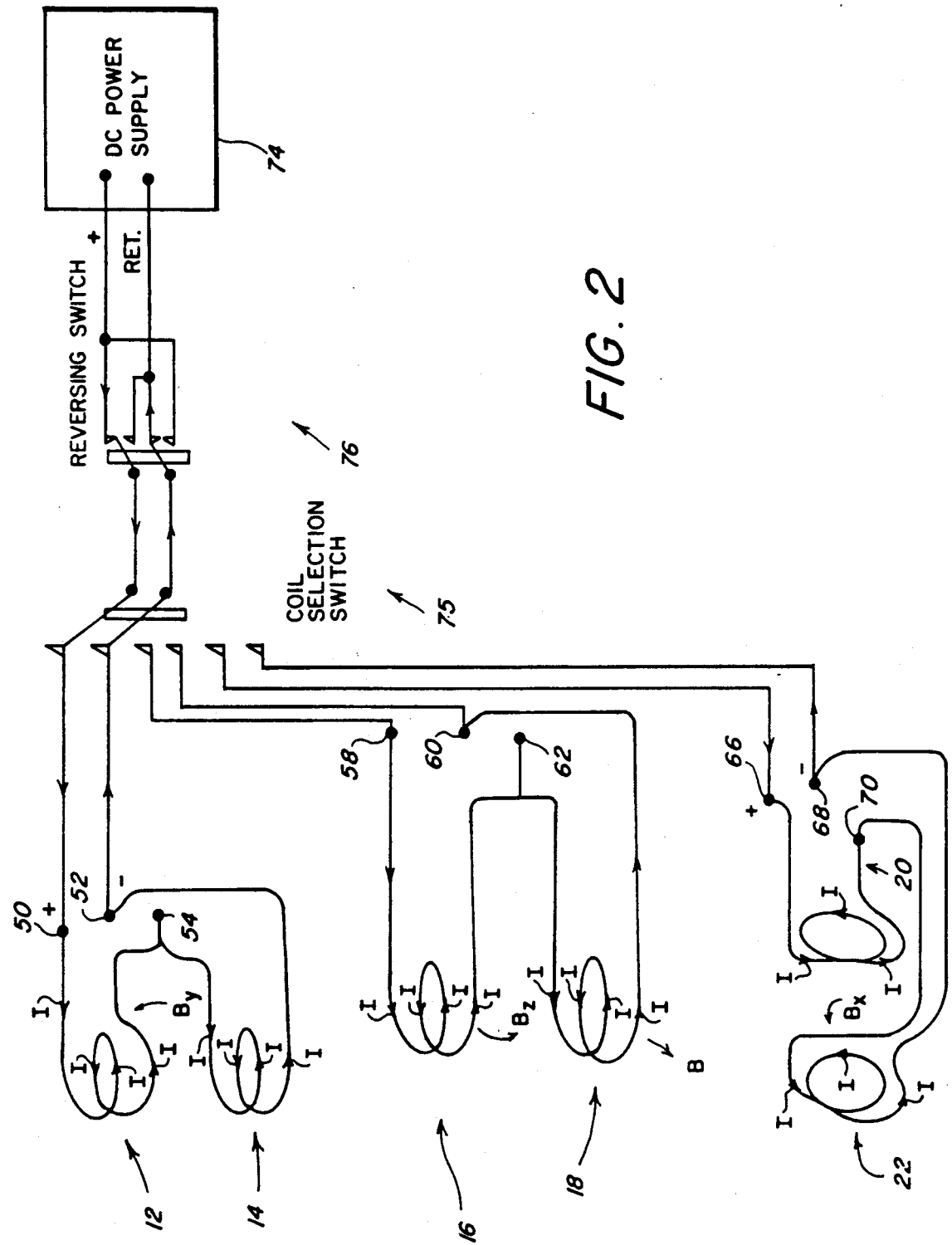
FIG. 2 is a circuit diagram of a circuit for driving a single set of coils of FIG. 1.

FIG. 2 shows a circuit for driving a single set of coils of the array of FIG. 1 in a Helmholtz coil mode. A DC power supply 74 provides power for a set of coils. A selection switch 75 selects a set of coils. A reversal switch 76 determines whether the currrent in the two coils of a set is sent through the coils in a clockwise direction or in a counterclockwise direction.

Figure 3:
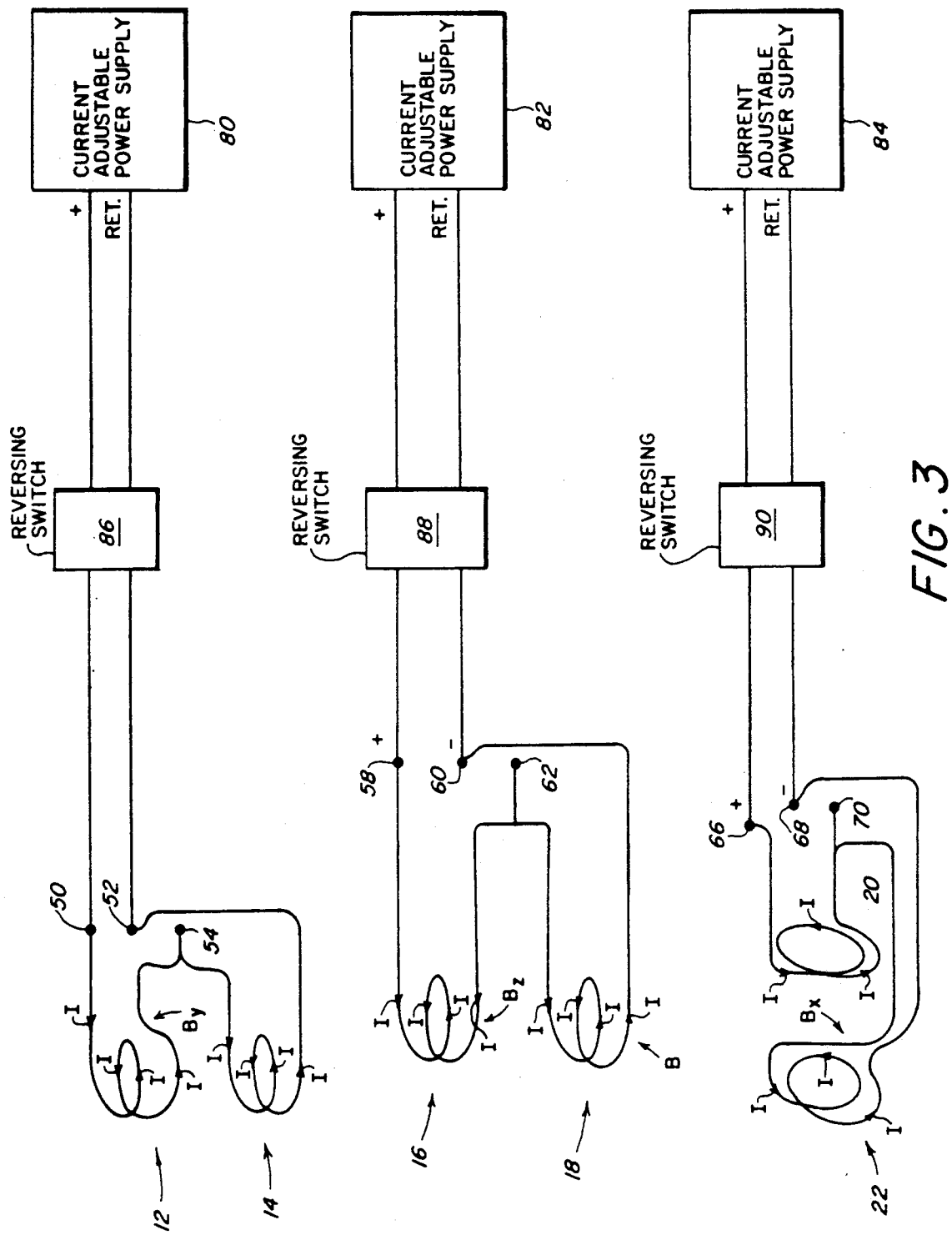
FIG. 3 is a circuit diagram of a circuit for simultaneously driving three sets of coils.

FIG. 3 shows a circuit for driving all three sets of coils, simultaneously, in a Helmholtz coil mode. Power supply 80 drives coils 12 and 14. Power supply 82 drives coils 16 and 18. Power supply 84 drives coils 20 and 22. Reversing switches 86, 88 and 90 are used to reverse the current through the first, second and third sets of coils, respectively.

Figure 4:
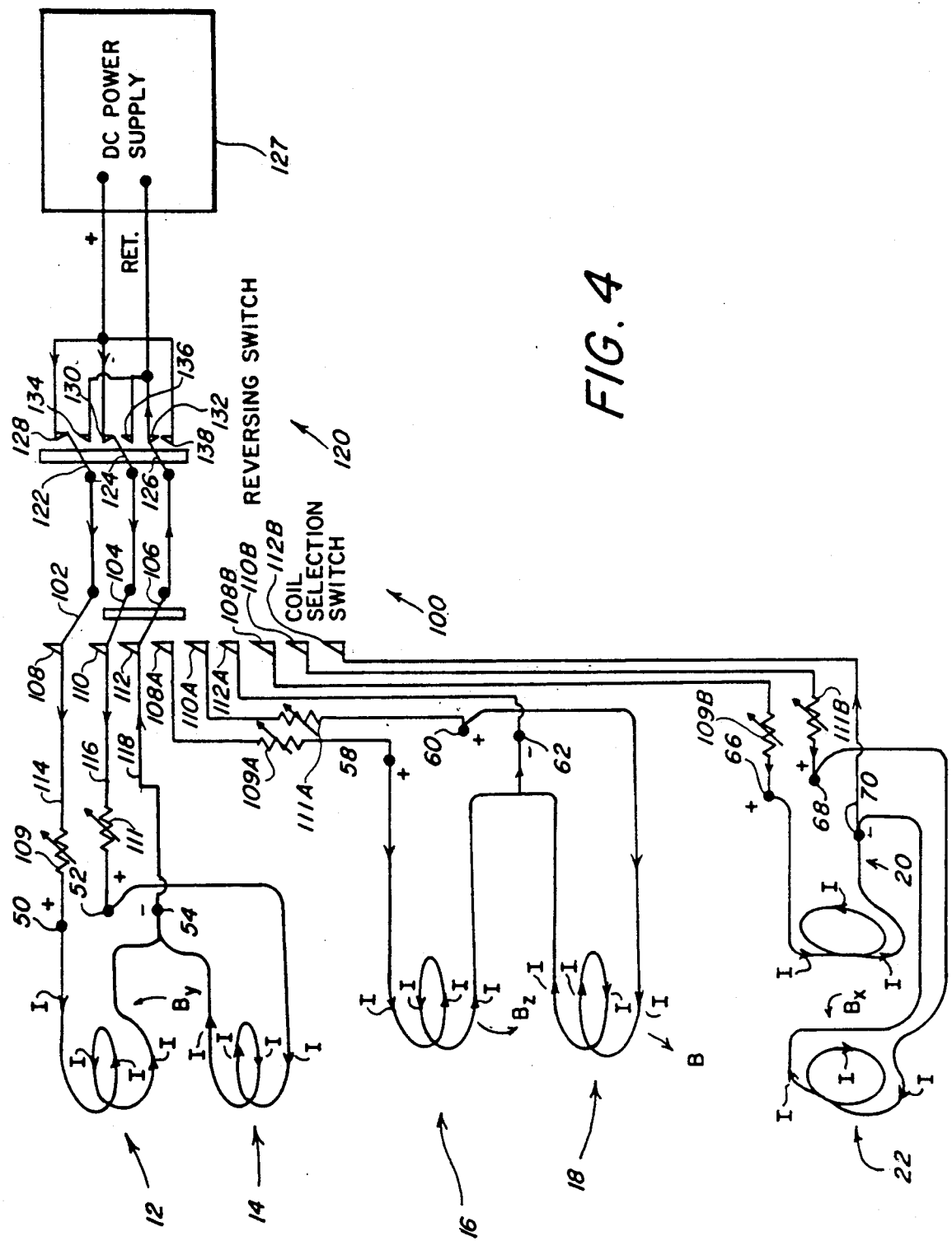
FIG. 4 is a circuit diagram of a circuit for driving a single set of coils of FIG. 1 in a deGaussing mode.

FIG. 4 shows a circuit arrangement containing the three nested sets of coils 12 and 14, 16 and 18, and 20 and 22 the circuit arrangement being connected to a deGaussing mode. Coil selection switch 100 selects one of the three sets of coils. In FIG. 4 coil selection switch 100 is shown selecting the set of coils 12 and 14. The coil selection switch 100 has three moveable contact arms 102, 104 and 106. These contact arms are shown making electrical contact with stationary contacts 108, 110 and 112 respectively. The stationary contact 108 is connected to variable resistor 109 by means of lead 114. The variable resistor 109 is connected to terminal 50 of the first set of coils 12 and 14. The stationary contact 101 is connected to variable resistor 111 by means means of lead 116. The variable resistor 111 is connected to terminal 52 of the first set of coils 12 and 14. Stationary contact 112 is connected to terminal 54 by means of lead 118. Variable resistors 109A and 111A are in series circuit between terminals 58 and 60 and a stationary contact 108A and 110A of switch 100. Also, variable resistors 109B and 111B are in series circuit between terminals 66 and 68 and stationary contacts 108B and 110B of switch 100.

The variable resistors 109 and 111 can be set to different resistance values in order to produce unequal currents through coils 12 and 14. The unequal currents can be made of values so that a resultant magnetic field between coils 12 and 14 can be made of a magnitude to cancel out the earth's magnetic field between coils 12 and 14. Resistors 109B and 111B can be set to cancel out the earth's magnetic field between coils 20 and 22. Resistors 109A and 111A can be set to cancel out the earth's magnetic field between coils 16 and 18. A magnetometer or magnetic needle may be used to verify that the earth's magnetic field has been canceled out in the three directions that are perpendicular, respectively, to the three sets of coils. The magnetometer or other such device would be placed at the center of the three sets of coils.

In the deGaussing configuration shown in FIG. 4, positive current goes into terminal 50 and through coil 12 and then out of terminal 54. Positive current also goes into terminals 52 and thence through coil 14 and out of terminal 54. Thus coils 12 and 14 together act as deGaussing coils to provide an electromagnetic field free environment between coils 12 and 14.

In FIG. 4, a switch 120 has three contact arms 122, 124 and 126. A positive voltage is supplied through contact arms 122 and 124 of switch 120 to contact arms 102 and 104 of switch 100. A negative voltage is supplied through contact arm 126 to contact arm 106. A positive voltage is supplied by power supply 127 to contacts 128 and 130 of switch 120. A negative voltage is supplied by power supply 127 to contact 132 of switch 120. The current can be reversed through coils 12 and 14 by moving contact arms 122, 124 and 126 of switch 120 to contacts 134, 136 and 138 respectively.

Figure 5:
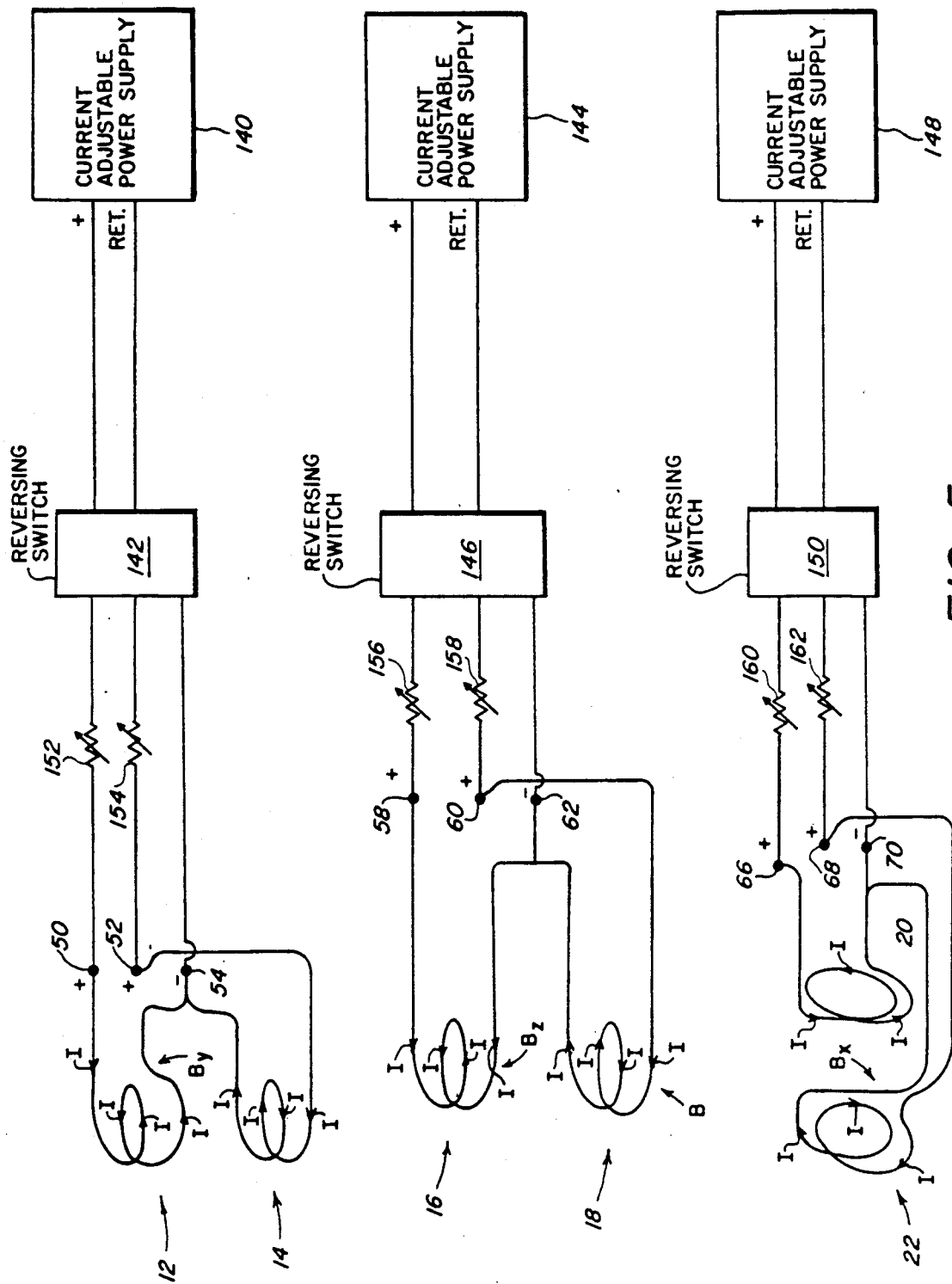
FIG. 5 is a circuit diagram of a circuit for simultaneously driving three sets of coils in a deGaussing mode.

As shown in FIG. 5 the first set of coils 12 and 14 are driven in a deGaussing mode by power supply 140 through coil reversing switch 142. Reversing switch 142 is constructed so that it is the same as reversing switch 120 shown in FIG. 4. Similarly the second set of coils 16 and 18 are driven in a deGaussing mode by power supply 144 through reversing switch 146. Also, the third set of coils 20 and 22 are driven in a deGaussing mode by power supply 148 through switch 150. Since each set of the three nested sets of coils is independently driven, a coil selection switch is not used in the circuit arrangement of FIG. 5. Variable resistors 152 and 154 are used to adjust current in coil 12 relative to current in coil 14. Variable resistors 156 and 158 are used to adjust current in coil 16 relative to current in coil 18. Variable resistors 160 and 162 are used to adjust current in coil 20 relative to current in coil 22.

While the present invention has been disclosed in connection with the preferred embodiment thereof, it should be understood that there may be other embodiments which fall within the spirit and scope of the invention as defined by the following claims.

What is claimed is:

1. An array of nested electromagnetic coils that is useable both as Helmholtz coils and as deGaussing coils, comprising:
   (a) first set of two electromagnetic coils, each electromagnetic coil having a first diameter, the first set of electromagnetic coils having a common axis, the common axis of the first set of electromagnetic coils being in a first direction;
   (b) A second set of two electromagnetic coils, each electromagnetic coil having a second diameter that is larger than the first diameter, the second set of electromagnetic coils encompassing and not touching, and therefore magnetically interfering less with the first set of electromagnetic coils, the second set of electromagnetic coils having a common axis, the common axis of the second set being essentially perpendicular to the common axis of the first set;
   (c) A third set of two electromagnetic coils, each electromagnetic coil having a third diameter that is larger than the second diameter, the third set of electromagnetic coils encompassing and not touching, and therefore magnetically interfering less with the first and second sets of electromagnetic coils, the third set of electromagnetic coils having a common axis, the common axis of the third set being essentially perpendicular to the common axis of each of the first set and the second set;
   (d) A first terminal connected to a first end of both coils of the first set of coils, a second terminal connected to a second end of one coil o the first set of coils, and a third terminal connected to a second end of the other coil of the first set of coils for allowing current to be sent in either like or opposite circular directions through the two coils, said first, second and third terminals being connectable to an external power supply;
   (e) A fourth terminal connected to a first end of both coils of the second set of coils, a fifth terminal connected to a second end of one coil of the second set of coils, and a sixth terminal connected to a second end of the other coil of the second set of coils for allowing current to be sent in either like or opposite circular directions through the two coils, said fourth, fifth and sixth terminals being connectable to an external power supply; and
   (f) A seventh terminal connected to a first end of both coils of the third set of coils, a eighth terminal connected to a second end of one coil of the third set of coils, and a ninth terminal connected to a second end of the other coil of the third set of coils for allowing current to be sent in either like or opposite circular directions through the two coils, said seventh, eighth and ninth terminals being connectable to an external power supply.

2. A test device for testing a sample within a space between coils, the coils useable either as Helmholtz coils or deGaussing coils, comprising:
   (a) A first set of two electromagnetic coils, each electromagnetic coil having a first diameter, the first set of electromagnetic coils having a common axis, the common axis of the first set of electromagnetic coils being in a first direction;
   (b) A second set of two electromagnetic coils, each electromagnetic coil having a second diameter that is larger than the first diameter, the second set of electromagnetic coils encompassing and not touching, and therefore magnetically interfering less with the first set of electromagnetic coils, the second set of electromagnetic coils having a common axis, the common axis of the second set being essentially perpendicular to the common axis of the first set;
   (c) A third set of two electromagnetic coils, each electromagnetic coil having a third diameter that is larger than the second diameter, the third set of electromagnetic coils encompassing and not touching, and therefore magnetically interfering less with the first and second sets of electromagnetic coils, the third set of electromagnetic oils having a common axis, the common axis of the third set being essentially perpendicular to the common axis of each of the first set and the second set;
   (d) Means for sending an electrical current through each said electromagnetic coil to produce a three dimensional magnetic field in a space surrounded by the three set of electromagnetic coils;

(e) Means for supporting the sample within the space;

(f) A right parallelogram shaped non-magnetic frame means for supporting said three sets of coils, said frame means being around the means for supporting the sample;

(g) A first terminal connected to a first end of both coils of the first set of coils, a second terminal connected to a second end of one coil of the first set of coils, and a third terminal connected to a second end of the other coil of the first set of coils for allowing current to be sent either in like or opposite circular directions through the two coils, said first, second and third terminals externally attached to the frame means, each terminal being connectable to an external power supply;

(h) A fourth terminal connected to a first end of both coils of the second set of coils, a fifth terminal connected to a second end of one coil of the second set of coils, and a sixth terminal connected to a second end of the other coil of the second set of coils for allowing current to be sent in either like or opposite circular directions through the two coils, said fourth, fifth and sixth terminals externally attached to the frame means, each terminal being connectable to an external power supply; and (i) A seventh terminal connected to a first end of both coils of the third set of coils, a eighth terminal connected to a second end of one coil of the third set of coils, and a ninth terminal connected to a second end of the other coil of the third set of coils for allowing current to be sent in either like or opposite circular directions through the two coils, said seventh, eighth and ninth terminals externally attached to the frame means, each terminal being connectable to an external power supply.

* * * * *